(12) United States Patent
Fenk

(10) Patent No.: US 7,495,276 B2
(45) Date of Patent: Feb. 24, 2009

(54) RADIO FREQUENCY ARRANGEMENT, METHOD FOR PRODUCING A RADIO FREQUENCY ARRANGEMENT AND USE OF THE RADIO FREQUENCY ARRANGEMENT

(75) Inventor: Josef Fenk, Eching/Ottenburg (DE)

(73) Assignee: Infineon Technologies AG, Munich (DE)

( * ) Notice: Subject to any disclaimer, the term of this patent is extended or adjusted under 35 U.S.C. 154(b) by 391 days.

(21) Appl. No.: 11/051,164

(22) Filed: Feb. 4, 2005

(65) Prior Publication Data

US 2005/0201175 A1 Sep. 15, 2005

(30) Foreign Application Priority Data

Feb. 5, 2004 (DE) .................. 10 2004 005 666

(51) Int. Cl.
*H01L 21/58* (2006.01)
(52) U.S. Cl. .................. 257/303; 257/304; 257/532; 257/623; 257/625; 257/686; 257/E27.016; 257/E27.088; 257/E27.026; 257/E21.614; 257/E21.512; 257/E21.649
(58) Field of Classification Search .......... 148/DIG. 12; 438/455; 257/303, 304, 532, 623, 625, 686, 257/E27.016, E27.088, E27.026, E21.614, 257/E21.512, E21.649
See application file for complete search history.

(56) References Cited

U.S. PATENT DOCUMENTS

| | | | | |
|---|---|---|---|---|
| 6,335,566 B1 * | 1/2002 | Hirashima et al. | .......... | 257/686 |
| 2003/0230797 A1 * | 12/2003 | Mashino | ...................... | 257/686 |
| 2004/0207042 A1 * | 10/2004 | McCormack et al. | ........ | 257/532 |
| 2005/0029666 A1 * | 2/2005 | Kurihara et al. | ............. | 257/772 |
| 2005/0051870 A1 * | 3/2005 | Yamazaki et al. | ........... | 257/531 |
| 2005/0082636 A1 * | 4/2005 | Yashima et al. | ............. | 257/532 |
| 2006/0267141 A1 * | 11/2006 | Saito | ........................... | 257/532 |
| 2006/0267414 A1 * | 11/2006 | Saito | ........................... | 257/532 |
| 2007/0018298 A1 * | 1/2007 | Gamand | ..................... | 257/686 |

FOREIGN PATENT DOCUMENTS

EP 0 393 089 B1 10/1990
JP 2003133508 A 5/2003

* cited by examiner

*Primary Examiner*—George Fourson
(74) *Attorney, Agent, or Firm*—Eschweiler & Associates, LLC

(57) ABSTRACT

A radio frequency arrangement is disclosed, having a first semiconductor body with an integrated circuit formed therein and also with first and second terminal locations. A second semiconductor body with a charge store integrated therein and with a first and second contact locations is arranged with its contact locations mutually facing the terminal locations of the first semiconductor body. The first terminal and the first contact location and also the second terminal and the second contact location are coupled to one another in order thus to form an integrated circuit and also a charge store for supplying the integrated circuit. Realizing the integrated circuit and the charge store separately enables a simple and cost-effective manufacturing procedure for the individual components.

13 Claims, 2 Drawing Sheets

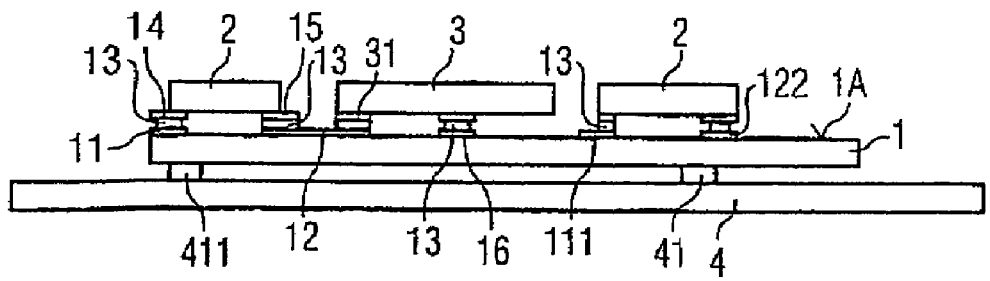
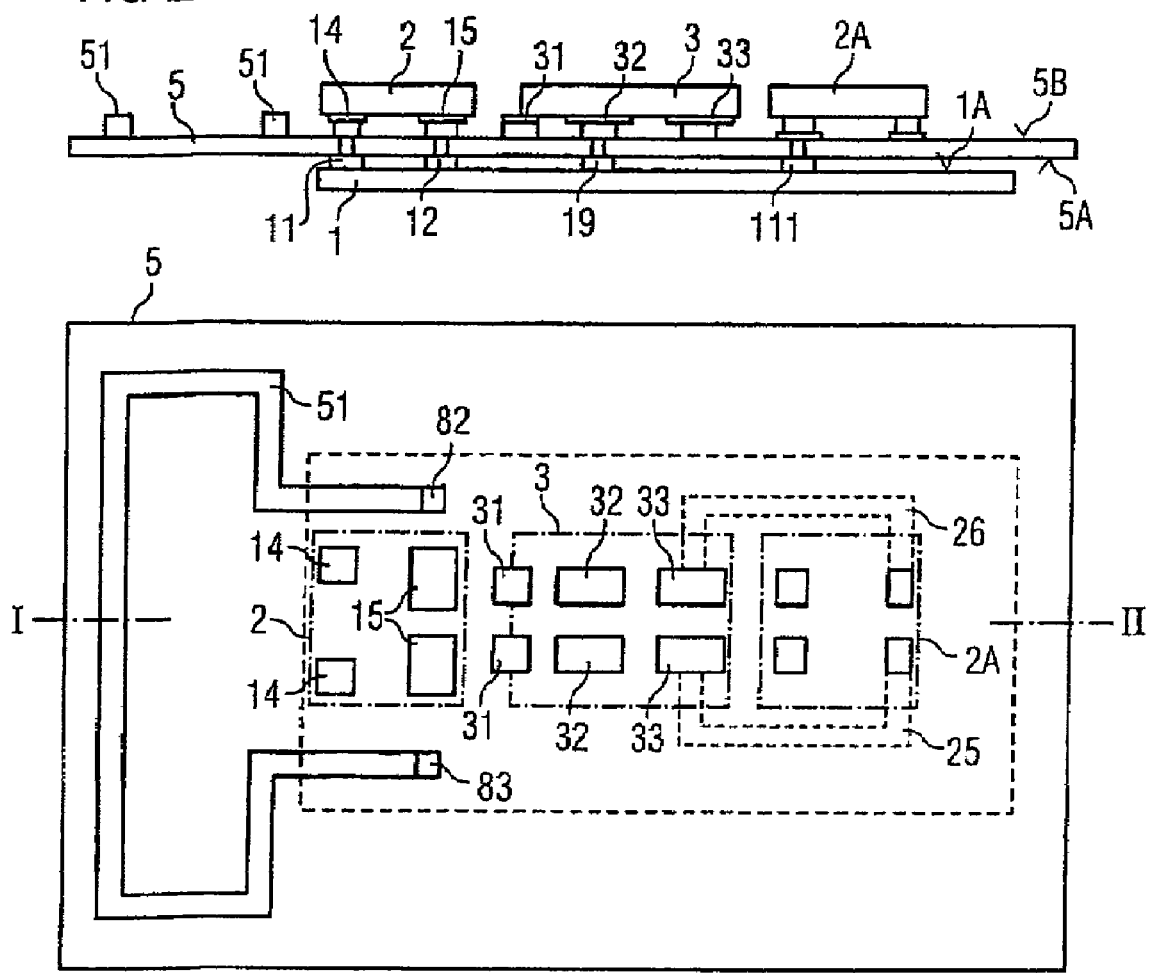

RADIO FREQUENCY ARRANGEMENT, METHOD FOR PRODUCING A RADIO FREQUENCY ARRANGEMENT AND USE OF THE RADIO FREQUENCY ARRANGEMENT

REFERENCE TO RELATED APPLICATIONS

This application claims the benefit of the priority date of German application DE 10 2004 005 666.8, filed on Feb. 5, 2004, the contents of which are herein incorporated by reference in their entirety.

FIELD OF THE INVENTION

The invention relates to a radio frequency arrangement and to a method for producing such a radio frequency arrangement. The invention additionally relates to a use of the radio frequency arrangement.

BACKGROUND OF THE INVENTION

Radio frequency circuits are integrated in semiconductor chips in order thus, by way of example, to output signals via an external antenna or to receive signals from the latter and process them further. Semiconductor chips with specific radio frequency circuits are provided for use in RF tags on smart cards and do not have their own power supply, for example, in the form of a battery. Power is then supplied to the circuit integrated in the chip by means of the energy of a signal received by the antenna. The received signal is rectified internally and its energy is used for operating the circuit or stored in a storage capacitor situated in the chip.

With present-day production methods, the simultaneous integration of a large storage capacitor and a logic circuit for a radio frequency arrangement on one and the same semiconductor chip requires very many and complex processes. Thus, by way of example, the number of masks to be used and exposure steps during production is very high. This leads to longer throughput times and lower yields, as a result of which the overall costs, in turn, rise.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a radio frequency arrangement in which the production costs are lower. The invention also comprises a method for producing such a radio frequency arrangement at low cost.

Thus, according to an embodiment the invention, a radio frequency arrangement comprises a first semiconductor body with an integrated circuit formed therein for signal processing. The first semiconductor body has a first partial surface, on which are formed a first and a second terminal location for outputting or feeding in a signal. Furthermore, the radio frequency arrangement comprises a second semiconductor body with a charge store integrated therein. A first and a second contact location for feeding in charge to the integrated charge store or for outputting charge from the integrated charge store are formed on a first partial surface of the second semiconductor body. The first partial surface of the first semiconductor body and the first partial surface of the second semiconductor body are arranged in a manner facing one another. The first terminal and the first contact location and also the second terminal and the second contact location are coupled to one another.

The separation of the integrated circuit in the first semiconductor body and the charge store in a second semiconductor body reduces the overall number of process steps for producing the two semiconductor bodies since both can be produced independently of one another. The complex and diverse process steps required for producing both units on one semiconductor chip are thereby avoided. The mutually facing arrangement, which is also referred to as face-to-face arrangement, permits an extremely space-saving design. The separation of the integrated circuit in a first semiconductor body and the charge store in a second semiconductor body makes it possible to carry out the processes for producing the charge store and the integrated circuit using known and well understood technologies, which reduces the throughput times and leads to higher yields.

In this case, it is advantageous if the charge store of the second semiconductor body contains at least one capacitor, which is preferably formed as a trench capacitor in a trench technology. This technology is also used during the production of memory cells and enables a particularly space-saving design of the capacitor with a charge storage density in the region of 1 farad/mm$^2$. It is advantageous to realize a plurality of capacitors in the semiconductor body and to interconnect them in a suitable manner in order thus to achieve a higher overall capacitance.

In one embodiment of the invention, the integrated circuit of the first semiconductor body is configured to receive a first potential at the first terminal and a second potential at the second terminal. The first and the second terminal of the first semiconductor body thus form a supply input for the integrated circuit. Consequently, the charge store of the second semiconductor body is coupled to the supply terminal of the integrated circuit. This permits a temporally limited operation of the integrated circuit with charge stored in the charge store of the second semiconductor body. As an alternative, the charge store of the second semiconductor chip can also be used as a blocking capacitor for reducing interference signals onto or from the supply line.

In another embodiment of the invention, the radio frequency arrangement comprises an antenna for receiving or outputting a radio frequency signal. In this case, the antenna is connected to a third and a fourth terminal of the first semiconductor body. In this context, it is particularly expedient to design the integrated circuit of the first semiconductor body for converting a signal applied to the third and to the fourth terminal into a DC voltage signal. The integrated circuit preferably outputs the DC voltage signal to the first and second terminals. The radio frequency arrangement according to the invention therefore enables reception of a radio frequency signal and the storage of the received energy on the charge store of the second semiconductor body. This is particularly advantageous for RF tag chips that do not have an independent power supply. The embodiment of the radio frequency arrangement according to the invention then permits operation of the integrated circuit in the first semiconductor body during reception of a radio frequency signal and, moreover, a temporally limited operation outside the range of the radio frequency signal on the basis of the energy stored in the charge store.

For the particularly advantageous formation of the coupling of the first terminal to the first contact location and of the second terminal to the second contact location, provision is made of a laminate containing a first partial surface and a second partial surface opposite to the first partial surface. In each case at least two terminals are provided on the first and second partial surfaces, said terminals being connected to one another by a plated-through hole. According to the invention, the coupling is effected by connecting the terminals of the first semiconductor body to the terminals of the laminate on the first partial surface and the contact locations of the second semiconductor body to the corresponding terminals of the laminate on the second partial surface.

The provision of such a laminate as a connecting element between the two semiconductor bodies enables a higher flexibility in the orientation of the contact locations on the respective partial surfaces of the semiconductor bodies. It is thus possible to dispense with a special orientation of the terminals on the partial surfaces of the first and second semiconductor bodies since a connection is ensured by the laminate.

The method according to another embodiment of the invention for producing a radio frequency arrangement first comprises provision of a first semiconductor body with an integrated circuit formed therein, and also provision of a second semiconductor body with a charge store formed therein. The first semiconductor body comprises, on a first partial surface, a first and a second terminal for feeding in or outputting a signal, the terminals being coupled to the integrated circuit. Furthermore, a first and a second contact location are provided on a first partial surface of the second semiconductor body, said contact locations being designed for feeding in charge to the charge store or for outputting charge stored thereon. The method furthermore comprises arrangement of the first partial surface of the first semiconductor body and of the first partial surface of the second semiconductor body in such a way that the two partial surfaces face one another. It is then provided that the respective first terminals of the first partial surface of the first semiconductor body and the first partial surface of the second semiconductor body and the respective second terminals of the partial surfaces of the first and second semiconductor body, respectively, are coupled to one another.

Consequently, in the case of the production method according to the embodiment of the invention, the radio frequency arrangement is no longer implemented in a single semiconductor body, rather different process steps are carried out separately and the two semiconductor bodies are provided. The separate production permits optimization of the individual process steps with regard to their number and also the overall costs.

The provision of the second semiconductor body expediently comprises provision of a semiconductor substrate and formation of at least one charge store by means of a trench technology and also provision of a contact-connection possibility for the charge store. In the case of charge stores having very high storage capacitances, the separate formation on a dedicated semiconductor body is advantageous owing to the reduced production costs incurred.

The arrangement step is carried out cost-effectively by means of a face-to-face mounting or in face-to-face technology.

Such a radio frequency arrangement is particularly well suited to use in smart cards in which the radio frequency arrangement is arranged in a cutout of a data carrier.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below on the basis of various exemplary embodiments with reference to the drawings, in which:

FIG. 1 is a side view illustrating the radio frequency arrangement according to a first exemplary embodiment of the invention, FIG. 2 is a side view and a plan view of a second exemplary embodiment of the invention, wherein the side view is taken at line I-II of the plan view.

DETAILED DESCRIPTION OF THE INVENTION

Figure 3:
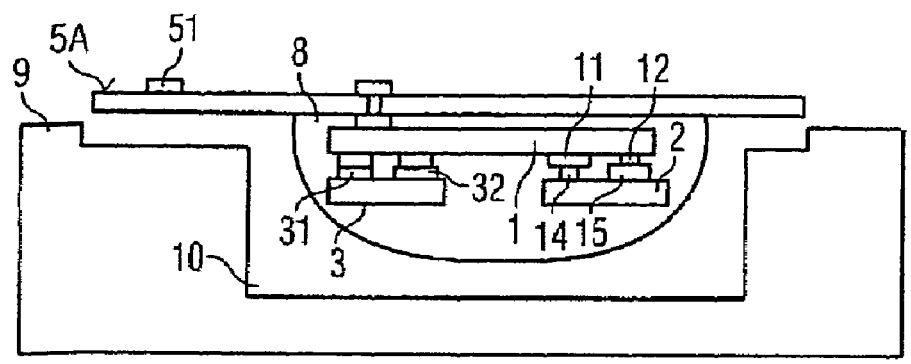
FIG. 3 is a side view illustrating an arrangement according to a third exemplary embodiment of the invention.

FIG. 1 shows a radio frequency arrangement according to one exemplary embodiment the invention. It comprises a semiconductor body 1 with a circuit integrated therein. The integrated circuit is not illustrated in FIG. 1 for reasons of clarity. The integrated circuit in the semiconductor body 1 is designed as a logic and control circuit in the present example. It comprises a plurality of switching elements designed for data processing. Depending on the requirements made of the circuit, a technology that is optimally suitable therefor is used for the production of the integrated circuit in the semiconductor body 1.

The semiconductor body 1 is fixed to a substrate 4 for additional mechanical stability. The mechanical substrate 4 comprises two supply lines with two terminals 41 and 411 for supplying the circuit integrated in the semiconductor body 1. For this purpose, the semiconductor body 1 contains two supply terminals on its underside, said supply terminals being connected to the terminals 41 and 411.

Various terminals are applied on the top side 1A of the semiconductor body 1. Said terminals are likewise coupled to the integrated circuit and designed for outputting various signals generated by the integrated circuit or for taking up signals that are processed further by the integrated circuit. Said terminals are in particular the terminals 11, 12, 111 and 122, which are designed for outputting a supply voltage to two further semiconductor bodies 2. The connection is effected by means of a solder 13, by which the contact locations 14 and 15 of the semiconductor bodies 2 are connected to the contact locations 11, 12 and, respectively, 111 and 122 of the first semiconductor body.

The semiconductor bodies 2 contain a plurality of capacitors connected in parallel. They are formed with the aid of a trench technology. The storage density of the capacitors is particularly high in this embodiment and lies in the range of 1 F/mm$^2$. A cross section through a plurality of trench capacitors connected in parallel in such a semiconductor body is shown, for example, in FIG. 4.

Figure 4:
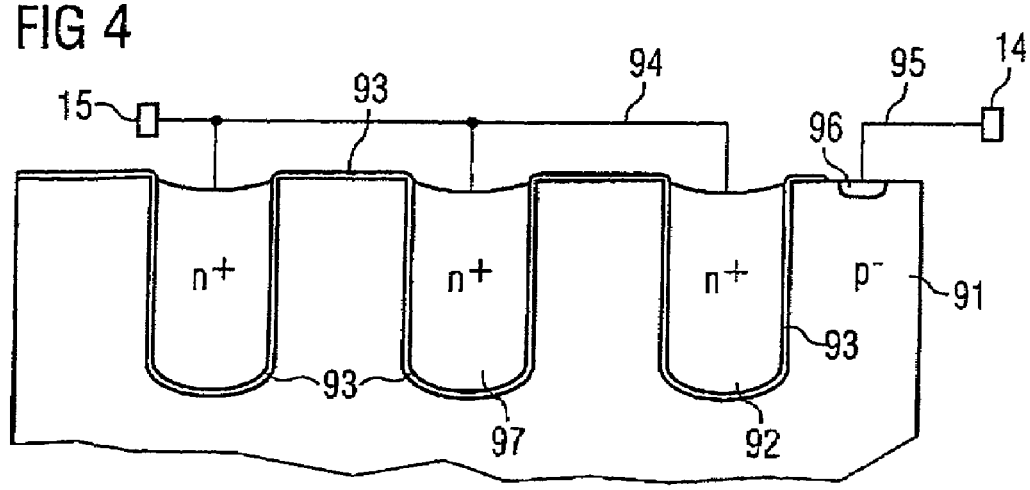
FIG. 4 is a cross section diagram illustrating a semiconductor body with charge stores as trench capacitors.

In FIG. 4, the substrate 91 of the semiconductor body is formed as a p-type substrate. The substrate contains a heavily p-doped region 96, which is formed as substrate terminal for the connection 95. The latter forms the first electrode of the capacitor and leads to the terminal 14. Furthermore, a plurality of depressions or trenches 97 introduced into the surface of the semiconductor substrate 91 can be discerned. The sidewalls of the trenches 97 and also the surface of the substrate 91 are covered with a dielectric 93. This is effected for example by oxidation of the surface. The dielectric 93 simultaneously forms the dielectric of the capacitor. A second semiconductor material 92 having a heavily n-doped charge type is introduced into the depression. The depression forms the second electrode of the trench capacitor. The second material in each trench 92 is connected to the second terminal 15 via the line 94. The individual trench capacitors are thus connected in parallel with one another and their capacitances are cumulated. The individual capacitors can also be realized in a different manner in the semiconductor material. Connecting them in parallel forms a single large capacitor in the semiconductor body. Other circuitry measures are also conceivable, and are contemplated by the present invention.

The semiconductor bodies 2 in accordance with FIG. 4 thus form a storage capacitor for storing large quantities of charge. If the trench capacitors in the semiconductor bodies 2 are charged, a supply is assured over a short period of time even in the absence of an external supply voltage. Connected in parallel with the supply terminals 41 and 411 of the radio frequency arrangement in accordance with FIG. 1, such a storage capacitor can also compensate for a voltage fluctuation on the supply lines of the substrate 4.

Further terminals 16 and 12 are additionally provided on the surface 1A of the first semiconductor body. These terminals are connected to two terminals 31 and 32 of a further semiconductor body 3 by a solder 13. The semiconductor body 3 contains a data memory with a plurality of individual memory cells. The formation is effected in a technology preferred therefor. For a nonvolatile data memory, the latter can be formed by means of a flash technology, for example.

In this case, the semiconductor body 3 is arranged with its terminals on the surface 1A of the first semiconductor body 1 in such a way that the terminals 12 and 16 and, respectively, 31 and 32 provided for the connection are situated opposite one another, so that the solder enables an electrical connection between them. On account of the different process steps for producing the integrated circuit in the first semiconductor body 1 and the memory cells in the semiconductor body 3, it is practical, for cost reasons, firstly to fabricate them separately and then to arrange them opposite one another. A connection is then effected by a solder applied between the contacts. This type of arrangement is also called face-to-face arrangement.

In addition, during the arrangement and connection of the semiconductor bodies 1 and 3, the separately produced storage capacitor in the semiconductor bodies 2 is also connected to the integrated circuit of the semiconductor body 1. The costs during face-to-face mounting for the additional mounting of the semiconductor body 2 are therefore only slightly higher. However, the semiconductor body 1 with the integrated circuit and also the storage capacitors in the semiconductor body 2 can be cost-effectively produced separately and in large quantities and with a high yield. The overall costs are thus reduced.

FIG. 2 shows a second exemplary embodiment of a radio frequency arrangement for use as an RF tag. In this case, the upper portion of the figure corresponds to a sectional view through the lower portion of the figure along the plane I-II. Identical components bear identical reference symbols in this case. A semiconductor body 1 containing both baseband and RF signal processing elements has the terminals 11 and 12 also 19 and 111 on its surface 1A. The terminals 11 and 12 are supply terminals, while the terminal 19 serves for data transmission. All the terminals are connected to contact locations on the underside 5A of a laminate 5, which, for their part, are contact-connected to corresponding contact locations on a top side 5B of the laminate. The laminate 5 contains a plurality of organic layers and also individual metallized connecting lines fitted between the organic layers. The lines are preferably composed of copper and are nickel-plated on the top side and also the underside in the region of the contact locations and also coated by electroplating with a thin gold layer for protection against oxidation. In addition, a metallized region in the form of an antenna 51 is applied on the top side 5B of the laminate 5 and leads to contact locations on the top side 5B of the laminate, which are contact-connected to terminals 82 and 83 of the semiconductor body 1 for the circuit integrated therein.

Furthermore, the radio frequency arrangement according to the invention contains a semiconductor body 2 and 2A, respectively, in accordance with FIG. 4 with, in each case, a plurality of integrated capacitors having a different capacitance which are connected in parallel therein. Said capacitors serve as a storage capacitor, and also for attenuating voltage fluctuations on the supply lines, and thus act as a filter.

Figure 5:
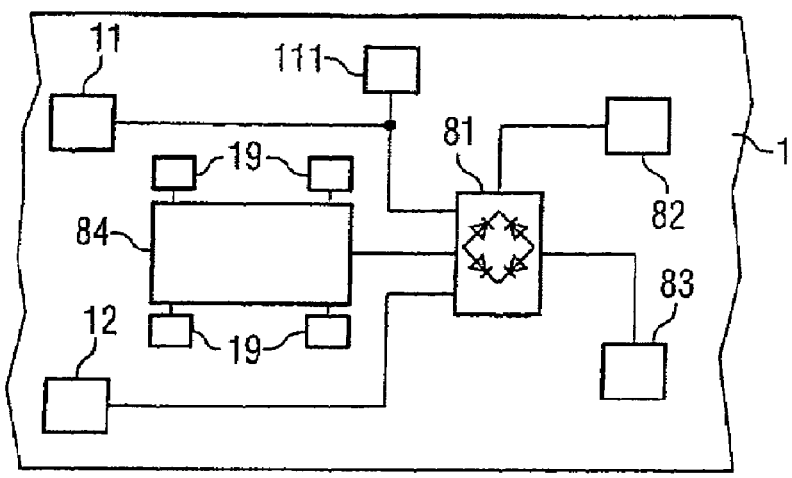
FIG. 5 is a circuit diagram of a semiconductor body with a circuit integrated therein according to a semiconductor body of FIG. 2.

FIG. 5 shows a detail from the integrated circuit of the semiconductor body 1 in accordance with FIG. 2. The integrated circuit comprises a rectifier circuit 81, which receives a radio frequency signal received via the antenna 51 at the two terminals 82 and 83, rectifies it into a DC voltage and uses it for the operation of the further circuits 84 in the semiconductor body 1. At the same time, part of the energy received via the antenna is output to the outputs 11 and 12 and 111, respectively, for charging the integrated storage capacitors of the semiconductor bodies 2 and 2A.

As a result, all the elements of the circuit 84 in the semiconductor body 1 are supplied with a sufficient voltage for operation during reception of a radio frequency signal and, in addition, the storage capacitors are charged. If the energy fed by means of the radio frequency signal is no longer sufficient for operating the integrated circuit, the charge stored in the storage capacitors can be used for a temporally limited operation. An independent power supply in the form of a battery is not necessary.

As can be discerned in the lower portion of FIG. 2, the storage capacitor in the semiconductor body 2A additionally contains a connection 25 and 26 in the laminate 5 to a supply terminal 33 of a third semiconductor body 3. The latter comprises a plurality of memory cells that are supplied with the charge stored in the storage capacitor of the semiconductor body 2A. Further contact locations 32 and 31 on the underside of the third semiconductor body serve for reading from the memory cells and for transferring the data to the integrated circuit in the semiconductor body 1. For this purpose, the terminal locations 32 and 31 are contact-connected to the terminal locations 19 on the top side 1A of the integrated semiconductor body 1 by the laminate 5.

FIG. 3 shows an arrangement according to the invention which is used in a data carrier card, preferably in a smart card. For this purpose, a data carrier body 9 is provided, comprising a cutout 10 for receiving the arrangement. The arrangement is formed as a chip module. The module comprises a module carrier 5 formed as a laminate and having an antenna 51 on a first surface 5A. The antenna is connected through the laminate 5 to a semiconductor body 1 and a terminal location situated on a first partial surface of the semiconductor body 1.

A plurality of terminal locations 11 and 12 and 111 and 122 are provided on an opposite partial surface of the semiconductor body 1.

The terminals of the semiconductor body 1 and of the integrated circuit situated therein are respectively connected to contact locations on the surface of a semiconductor body 2 and 3. The semiconductor body 1 comprises a circuit for RF signal processing; the semiconductor body 3 contains an integrated circuit for processing digital signals. The semiconductor body 2 contains a plurality of parallel-connected storage capacitors having a large capacitance for a voltage or power supply of the integrated circuits in the first or third semiconductor body.

For protection against damage, this circuit is surrounded with a resin or a plastic 8 in the form of a drop. The chip module comprising chip carrier 5 and the semiconductor bodies is introduced into the cutout 10 of the data carrier and connected to the latter.

For the production of the radio frequency arrangement according to the invention, the radio frequency arrangement with its elements is not implemented in a single semiconductor body, but rather, according to the invention, distributed between a plurality of semiconductor bodies on the basis of the required process steps. By way of example, logic elements may be accommodated on one semiconductor body, while data memory cells requiring a trench technology for production are provided on a second semiconductor body. In particular, storage capacitors for storing large quantities of charge and capacitors for smoothing voltage fluctuations on the supply line of the integrated circuit are accommodated separately in a second semiconductor body.

The construction and the procedure for production of the storage capacitors in the second semiconductor body are diverse and the example explained here is just one example thereof. A charge store integrated in a second semiconductor body may also be used for filtering interference signals on a supply line or be part of a signal filter. Furthermore, further semiconductor components may be integrated in the second semiconductor body.

The consistent separation of elements requiring a great variety of production processes into different semiconductor bodies nevertheless considerably reduces the number of manufacturing steps for the entire arrangement. Furthermore, the production of standardized integrated circuits increases the flexibility on account of the different combination possibilities. According to the invention, the individual semiconductor bodies are fabricated with their components that are integrated therein arranged in face-to-face mounting i.e. in a manner facing one another. This not only results in a small space requirement and also low overall costs, but enables jointly through the use of a connecting laminate the simple formation of RF tags for wirefree communication over short distances without an independent power supply.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A radio frequency arrangement, comprising:
   a first semiconductor body with an integrated circuit formed therein configured to provide signal processing, wherein the first semiconductor body comprises, on a first partial surface thereof, a first and a second terminal configured to output or receive a signal;
   a second semiconductor body with a charge store integrated therein, wherein the second semiconductor body comprises, on a first partial surface, a first and a second contact location configured to receive or output charge to the charge store;
   wherein the first partial surfaces of the first and second semiconductor bodies are arranged in a manner facing one another, and wherein the first terminal and the first contact location are coupled together and the second terminal and the second contact location are coupled together
   an antenna configured to receive or output a radio frequency signal, wherein the antenna is connected to a third and a fourth terminal of the first semiconductor body;
   wherein the integrated circuit of the first semiconductor body is configured to convert a time-varying signal applied to the third and the fourth terminal into a DC voltage signal, and output the DC voltage signal to the first and the second terminal; and
   wherein the coupling of the first terminal to the first contact location and of the second terminal and to the second contact location comprises a laminate, the laminate comprising:
   a first partial surface with a first and a second terminal; and
   a second partial surface opposite to the first partial surface thereof, with a third terminal thereon, wherein the third terminal is connected to the first terminal on the first partial surface, and having a fourth terminal on the second partial surface that is connected to the second terminal on the first partial surface, and
   wherein the laminate comprises a metallized region comprising an antenna.

2. The radio frequency arrangement of claim 1, wherein the integrated circuit of the first semiconductor body is configured to receive a first potential at the first terminal and a second potential at the second terminal.

3. The radio frequency arrangement of claim 1, wherein the charge store of the second semiconductor body comprises a capacitor.

4. The radio frequency arrangement of claim 3, wherein the capacitor of the second semiconductor body comprises a trench capacitor in a substrate of the second semiconductor body.

5. The radio frequency arrangement of claim 3, wherein the capacitor comprises a storage density of about one farad/mm2.

6. The radio frequency arrangement of claim 1, wherein the charge store comprises at least two parallel-connected capacitors integrated in the second semiconductor body.

7. The radio frequency arrangement of claim 1, further comprising an electrically conductive solder arranged between the respective terminals and respective contact locations, wherein the solder electrically connects the respective terminals to the respective contact locations.

8. A radio frequency arrangement, comprising:
- a laminate body having a top side and a bottom side, and a plurality of pass-through contacts extending from the top side to the bottom side;
- a first semiconductor body having a radio frequency circuit formed in a first surface thereof, wherein the first surface of the first semiconductor body faces the bottom side of the laminate body; and
- a second semiconductor body having a charge store formed in a first surface thereof, wherein the first surface of the second semiconductor body faces the top side of the laminate body,
- wherein contacts associated with the charge store are coupled to terminals associated with the radio frequency circuit through the pass-through contacts,
- further comprising a third semiconductor body having memory circuitry formed in a first surface thereof, wherein the first surface of the third semiconductor body faces the top side of the laminate body and is operably coupled to the charge store via a surface contact and to the radio frequency circuit through the pass-through contacts.

9. The radio frequency arrangement of claim 8, further comprising an antenna formed on the first surface of the first semiconductor body, and configured to provide energy received via incoming radio frequency signals to the radio frequency circuit for powering thereof.

10. The radio frequency arrangement of claim 9, wherein the antenna is coupled to the charge store through one or more pass-through contacts, and configured to store excess energy therein.

11. The radio frequency arrangement of claim 8, wherein the memory circuitry is configured to selectively receive power from the charge store.

12. A radio frequency arrangement, comprising:
- a laminate body having a top side and a bottom side, and a plurality of pass-through contacts extending from the top side to the bottom side;
- a first semiconductor body having a radio frequency circuit formed in a first surface thereof, wherein the first surface of the first semiconductor body faces the bottom side of the laminate body;
- a second semiconductor body having a charge store formed in a first surface thereof, wherein the first surface of the second semiconductor body faces the top side of the laminate body;
- wherein contacts associated with the charge store are coupled to terminals associated with the radio frequency circuit through the pass-through contacts; and
- wherein a metallized region in the form of an antenna is applied to the top side of the laminate body.

13. The radio frequency arrangement of claim 12, further comprising a third semiconductor body having memory circuitry formed in a first surface thereof, wherein the first surface of the third semiconductor body faces the top side of the laminate body and is operably coupled to the charge store via a surface contact and to the radio frequency circuit through the pass-through contacts.

* * * * *